(12) United States Patent
Liu et al.

(10) Patent No.: US 8,860,482 B1
(45) Date of Patent: Oct. 14, 2014

(54) TECHNIQUES FOR ADJUSTING GEARS OF AN OSCILLATOR

(71) Applicant: Altera Corporation, San Jose, CA (US)

(72) Inventors: Xiong Liu, Cupertino, CA (US); Thungoc Tran, San Jose, CA (US); Tim Tri Hoang, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/918,739

(22) Filed: Jun. 14, 2013

(51) Int. Cl.
*H03L 7/06* (2006.01)
*H03L 7/099* (2006.01)

(52) U.S. Cl.
CPC ...................... *H03L 7/099* (2013.01)
USPC ........................... 327/157; 327/148

(58) Field of Classification Search
USPC .................................. 327/148, 157
See application file for complete search history.

(56) References Cited

U.S. PATENT DOCUMENTS

| | | | |
|---|---|---|---|
| 6,504,437 B1 * | 1/2003 | Nelson et al. ................. | 331/14 |
| 6,747,497 B2 | 6/2004 | Ingino, Jr. | |
| 6,756,838 B1 * | 6/2004 | Wu et al. ...................... | 327/536 |
| 6,806,786 B1 | 10/2004 | Lam et al. | |
| 6,977,558 B2 | 12/2005 | Cranford, Jr. et al. | |
| 7,064,621 B2 * | 6/2006 | Nakanishi .................... | 331/57 |
| 7,602,260 B1 | 10/2009 | Atesoglu | |
| 7,663,446 B1 * | 2/2010 | Surin .......................... | 331/185 |
| 7,728,674 B1 * | 6/2010 | Hoang et al. ................ | 331/2 |
| 7,834,712 B2 | 11/2010 | Shumarayev et al. | |
| 7,928,812 B2 * | 4/2011 | Malladi et al. .............. | 331/179 |
| 7,940,140 B2 * | 5/2011 | Zeng et al. .................. | 331/179 |
| 8,035,453 B1 | 10/2011 | Wong et al. | |
| 8,179,174 B2 * | 5/2012 | Bunch ........................ | 327/156 |
| 2010/0308922 A1 * | 12/2010 | Feng et al. .................. | 331/34 |
| 2011/0298503 A1 * | 12/2011 | Obkircher et al. .......... | 327/147 |
| 2013/0057325 A1 * | 3/2013 | Dong et al. ................. | 327/147 |
| 2013/0082754 A1 * | 4/2013 | Chern et al. ................ | 327/157 |
| 2014/0097878 A1 * | 4/2014 | Sindalovsky et al. ....... | 327/156 |
| 2014/0145769 A1 * | 5/2014 | Lin ............................ | 327/158 |

* cited by examiner

*Primary Examiner* — Adam Houston
(74) *Attorney, Agent, or Firm* — Steven J. Cahill

(57) ABSTRACT

A phase-locked loop circuit includes an oscillator circuit that generates a clock signal. The oscillator circuit has gears. Each of the gears of the oscillator circuit corresponds to a respective frequency range of the clock signal. A gear control circuit includes a regulator circuit that provides a supply voltage to the oscillator circuit. Each of the gears of the oscillator circuit corresponds to a different supply voltage provided by the regulator circuit. The regulator circuit varies the supply voltage to change a selected one of the gears of the oscillator circuit. The gear control circuit varies the supply voltage for one of the gears of the oscillator circuit to adjust a frequency range of that gear of the oscillator circuit.

20 Claims, 5 Drawing Sheets

TECHNIQUES FOR ADJUSTING GEARS OF AN OSCILLATOR

FIELD OF THE DISCLOSURE

The present disclosure relates to electronic circuits, and more particularly, to techniques for adjusting gears of an oscillator.

BACKGROUND

A phase-locked loop (PLL) is an electronic circuit that adjusts the frequency of a feedback clock signal based on the frequency of an input reference clock signal. Phase-locked loops (PLLs) are in many integrated circuits, providing periodic signals for data recovery, data transfer, and other clocking functions. PLLs often supply a clock signal generated by an oscillator to one or more counters or dividers that divide the clock signal to a lower frequency clock signal for distribution around an integrated circuit or system.

BRIEF SUMMARY

According to some embodiments, a phase-locked loop circuit includes an oscillator circuit that generates a clock signal. The oscillator circuit has gears. Each of the gears of the oscillator circuit corresponds to a respective frequency range of the clock signal. A gear control circuit includes a regulator circuit that provides a supply voltage to the oscillator circuit. Each of the gears of the oscillator circuit corresponds to a different supply voltage provided by the regulator circuit. The regulator circuit varies the supply voltage to change a selected one of the gears of the oscillator circuit. The gear control circuit varies the supply voltage for a gear of the oscillator circuit to adjust a frequency range of that gear of the oscillator circuit.

Various objects, features, and advantages of the present invention will become apparent upon consideration of the following detailed description and the accompanying drawings.

DETAILED DESCRIPTION

A phase-locked loop circuit (PLL) typically has an oscillator. An oscillator may generate one clock signal or multiple clock signals having the same frequency or different frequencies. The tuning range of an oscillator indicates the valid operating frequency range of its one or more output clock signals. The tuning range of an oscillator falls within the maximum frequency and the minimum frequency of one or more output clock signals of the oscillator.

If the frequencies of the output clock signals of an oscillator move outside the tuning range of the oscillator, the performance of the oscillator may degrade substantially. For example, a substantial amount of jitter may be introduced into the output clock signals. Also, the oscillator may stop oscillating or run very fast. Depending on the design margin of the other circuitry in the PLL, some circuits in the PLL may not be able to keep up with an increased output clock frequency, causing a functional failure in the PLL.

In some applications, the frequencies of clock signals vary substantially. For example, clock signals in a programmable logic integrated circuit may vary substantially depending on the user configuration. Therefore, it is desirable to provide PLLs that can function in response to a wide range of reference clock signal frequencies, while maintaining acceptable phase noise, jitter, and stability performance.

In some embodiments, a PLL generates a control voltage based on a phase comparison between a reference clock signal and a feedback clock signal. The control voltage is provided to the oscillator. The output clock signals of the oscillator vary based on changes in the control voltage.

According to some embodiments described herein, an oscillator in a PLL has a tuning range that includes multiple gears. Each of the gears in the tuning range of the oscillator corresponds to a different range of frequencies of the output clock signals of the oscillator. The oscillator has multiple gears that overlap in frequency to provide a wide tuning range of output clock signal frequencies for the PLL.

In some embodiments, an oscillator supply voltage is provided to the oscillator in a PLL. The oscillator supply voltage determines the gear selected for the oscillator. The oscillator supply voltage is varied to select a different gear for the oscillator. Each of the gears of the oscillator is generated in response to a different oscillator supply voltage. The frequencies of the output clock signals of the oscillator vary within the frequency range of the selected gear based on changes in the control voltage.

According to some embodiments, a gear control circuit adjusts one or more of the gears of the oscillator to provide overlap between adjacent gears over expected variations in process and temperature. The gear control circuit adjusts one or more of the gears of the oscillator by varying the oscillator supply voltages for the corresponding gears.

Figure 1:
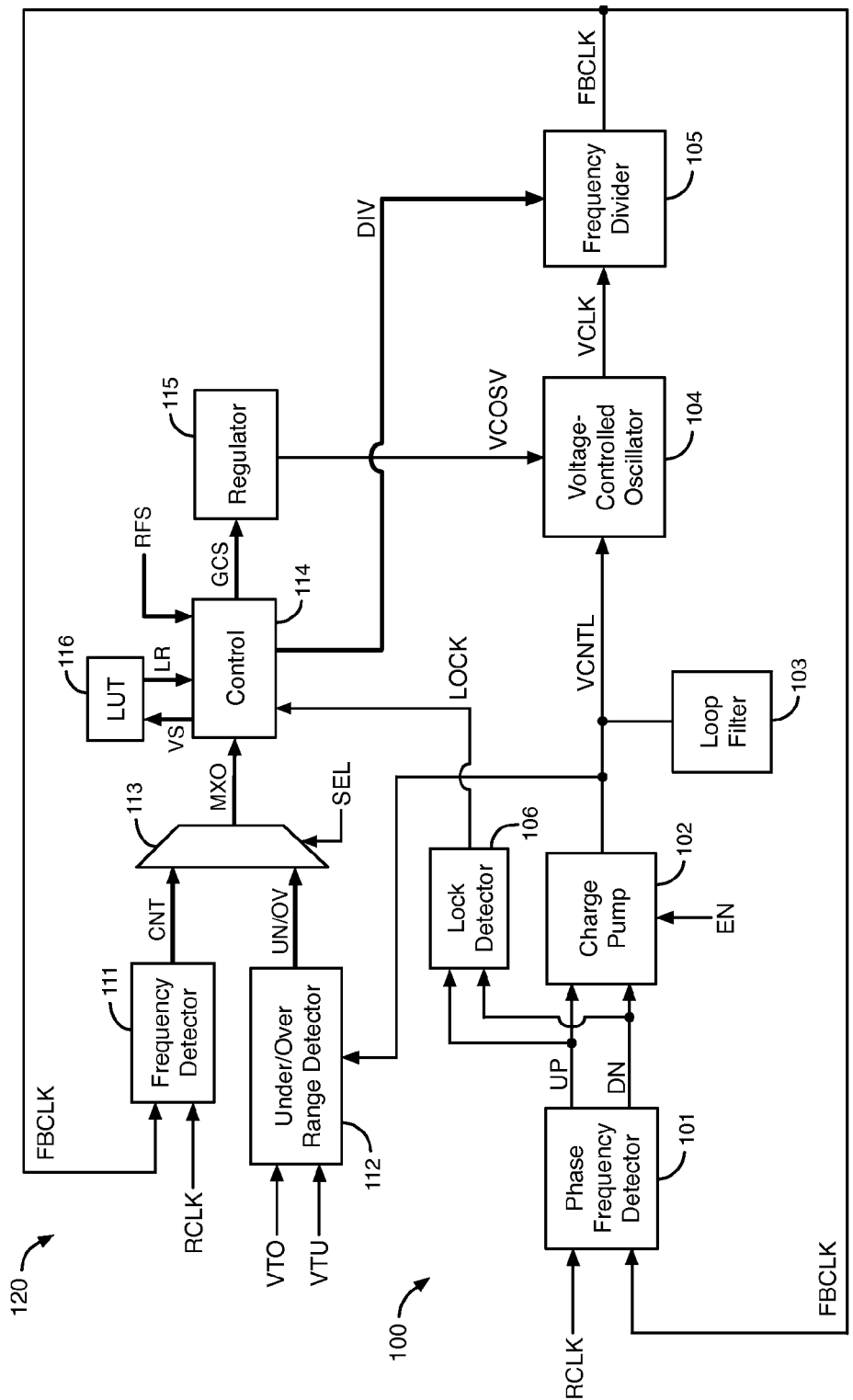
FIG. 1 illustrates a phase-locked loop (PLL) circuit and a gear control circuit, according to an embodiment of the present invention.

FIG. 1 illustrates a phase-locked loop (PLL) circuit 100 and a gear control circuit 120, according to an embodiment of the present invention. PLL circuit 100 includes phase frequency detector (PFD) circuit 101, charge pump (CP) circuit 102, loop filter (LF) circuit 103, voltage-controlled oscillator (VCO) circuit 104, frequency divider circuit 105, and lock detector circuit 106. Gear control circuit 120 includes frequency detector circuit 111, under and over range detector circuit 112, multiplexer circuit 113, control circuit 114, programmable voltage regulator circuit 115, and look-up table (LUT) circuit 116.

PLL circuit 100 is one example of a PLL that can be used with embodiments of the present invention. It should be understood that embodiments of the present invention can be used with PLLs having numerous other configurations. The circuitry shown in FIG. 1 is typically fabricated on an integrated circuit, such as an application specific integrated circuit (ASIC) or a field programmable gate array (FPGA).

PLL circuit 100 is configurable to operate in a PLL mode. The operation of PLL mode is now described. During the PLL mode, PLL circuit 100 generates a periodic feedback clock signal FBCLK based on a periodic reference clock signal RCLK. During the PLL mode, the reference clock signal RCLK is provided to a first input of phase frequency detector (PFD) circuit 101. PFD 101 compares the phase and the frequency of reference clock signal RCLK to the phase and the frequency of feedback clock signal FBCLK to generate pulses in phase error signals UP and DN. Phase error signals UP and DN are provided to inputs of charge pump 102 and to inputs of lock detector 106.

Charge pump (CP) 102 generates control voltage VCNTL at its output. CP 102 controls control voltage VCNTL based on the UP and DN phase error signals. The control voltage VCNTL generated by CP 102 is low pass filtered by loop filter (LF) circuit 103. According to an exemplary embodiment, charge pump 102 sends charge to loop filter 103 in response to logic high pulses in the UP signal, and charge pump 102 drains charge from loop filter 103 in response to logic high pulses in the DN signal.

The control voltage VCNTL filtered by loop filter 103 is provided to a control input of voltage-controlled oscillator (VCO) circuit 104. VCO 104 generates a periodic output clock signal VCLK. VCO 104 may also generate other periodic output clock signals. VCO 104 controls the frequencies of its output clock signals, including clock signal VCLK, based on control voltage VCNTL.

The output clock signal VCLK of VCO 104 is provided to an input of frequency divider circuit 105. Frequency divider circuit 105 generates the feedback clock signal FBCLK. Frequency divider circuit 105 causes the frequency of feedback clock signal FBCLK to equal the frequency of the output clock signal VCLK of VCO 104 divided by a frequency division value. The frequency division value may be, for example, an integer or fractional number. Digital control signals DIV determine the frequency division value of frequency divider circuit 105. The frequency division value of frequency divider circuit 105 can be changed by adjusting the digital values of digital control signals DIV. Control circuit 114 generates control signals DIV, as shown in FIG. 1. According to alternative embodiments, control signals DIV are generated by another circuit in the same integrated circuit as the circuitry shown in FIG. 1 or by a device that is external to the integrated circuit.

According to an embodiment, phase frequency detector circuit 101 generates logic high pulses in the UP signal that are longer than the logic high pulses in the DN signal when the frequency of reference clock signal RCLK is greater than the frequency of feedback clock signal FBCLK. When logic high pulses in the UP signal are longer than logic high pulses in the DN signal, charge pump 102 increases control voltage VCNTL, causing the frequency of the output clock signal VCLK of VCO 104 to increase, which causes the frequency of the FBCLK clock signal to increase.

In this embodiment, phase frequency detector circuit 101 generates logic high pulses in the DN signal that are longer than the logic high pulses in the UP signal when the frequency of feedback clock signal FBCLK is greater than the frequency of reference clock signal RCLK. When logic high pulses in the DN signal are longer than logic high pulses in the UP signal, charge pump 102 decreases control voltage VCNTL, causing the frequency of the output clock signal VCLK of VCO 104 to decrease, which causes the frequency of the FBCLK clock signal to decrease.

VCO 104 varies the frequency of output clock signal VCLK based on changes in the control voltage VCNTL, until reference clock signal RCLK and feedback clock signal FBCLK are phase aligned or nearly phase aligned and have the same or substantially the same frequency. PLL 100 is in lock when reference clock signal RCLK and feedback clock signal FBCLK have the same or approximately the same frequency and phase.

Lock detector circuit 106 generates a LOCK signal based on the phase error signals UP and DN. Lock detector circuit 106 asserts the LOCK signal to a logic high state when PLL 100 is in lock. Lock detector circuit 106 de-asserts the LOCK signal to a logic low state when PLL 100 is not in lock. The LOCK signal is provided to an input of control circuit 114.

As an example, lock detector circuit 106 may generate a logic high state in the LOCK signal if the durations of the logic high pulses in the UP signal are the same as the durations of the logic high pulses in the DN signal within a margin of error, indicating that the phases of clock signals FBCLK and RCLK are aligned.

The tuning range of VCO circuit 104 includes multiple gears. Each of the gears in the tuning range of VCO circuit 104 is a different range of frequencies that VCO circuit 104 can generate in its output clock signals, including clock signal VCLK. Programmable voltage regulator circuit 115 is programmable to select the gear of VCO circuit 104.

Programmable voltage regulator circuit 115 generates an oscillator supply voltage VCOSV. Oscillator supply voltage VCOSV is provided to a supply voltage input of VCO circuit 104. VCO circuit 104 receives charge and current from the oscillator supply voltage VCOSV at its supply voltage input. The oscillator supply voltage VCOSV determines the gear of VCO circuit 104. Programmable voltage regulator circuit 115 selects the oscillator supply voltage VCOSV, and thus the gear of VCO circuit 104, based on the digital values of digital gear control signals GCS. Gear control signals GCS are generated by control circuit 114.

Programmable voltage regulator circuit 115 may, for example, include a selectable resistor divider having resistors coupled in series between a supply voltage and ground. The selectable resistor divider generates several different voltages. Each of the voltages is generated between two of the resistors in the selectable resistor divider. In this embodiment, programmable voltage regulator circuit 115 selects a different voltage from the selectable resistor divider as oscillator supply voltage VCOSV in response to each unique set of digital values generated in the gear control signals GCS.

In another embodiment, programmable voltage regulator circuit 115 has a programmable current source circuit. The programmable current source circuit generates different oscillator supply voltages VCOSV in response to different sets of digital values of gear control signals GCS. For example, programmable voltage regulator circuit 115 may have the circuit structure of the programmable regulator circuit shown in and described with respect to FIGS. 4-5 of commonly-assigned U.S. Pat. No. 7,602,260, issued Oct. 13, 2009, which is incorporated by reference herein in its entirety.

In response to receiving gear control signals GCS that correspond to a gear of VCO circuit 104, programmable voltage regulator circuit 115 generates an oscillator supply voltage VCOSV corresponding to that gear. VCO circuit 104 generates frequencies in its output clock signals that are within the frequency range of a gear in response to receiving the oscillator supply voltage VCOSV corresponding to that gear. Thus, control circuit 114 can select a gear for VCO circuit 104 by generating digital values in the gear control signals GCS corresponding to that gear.

Each of the gears in the tuning range of VCO circuit 104 is generated in response to a different supply voltage VCOSV.

Thus, each of the gears in the tuning range of VCO circuit 104 corresponds to a different oscillator supply voltage VCOSV. Programmable voltage regulator circuit 115 selects different oscillator supply voltages VCOSV in response to different digital values of the gear control signals GCS. Programmable voltage regulator circuit 115 varies the oscillator supply voltage VCOSV in response to a change in the digital values of the gear control signals GCS to select a different gear for VCO circuit 104 or to adjust the frequency range of a selected gear. The frequencies of the output clock signals of VCO circuit 104 vary within the frequency range of the selected gear based on changes in control voltage VCNTL. Regulator circuit 115 can only select one gear for VCO circuit 104 at any one instant of time.

VCO circuit 104 may be, for example, a voltage-controlled ring oscillator circuit or a voltage-controlled inductor-capacitor (LC) tank oscillator circuit. If VCO circuit 104 is a ring oscillator, the ring oscillator has an odd number of inverting buffer circuits coupled together in a ring configuration, and the oscillator supply voltage VCOSV is provided as a supply voltage to each of the inverting buffer circuits. If VCO circuit 104 is an LC tank oscillator circuit, the LC tank oscillator includes an inductor, one or more varactors, and transistors. In this embodiment, the oscillator supply voltage VCOSV provides charge to the LC tank oscillator.

According to another embodiment, VCO circuit 104 includes two or more voltage-controlled oscillator circuits. Each voltage-controlled oscillator in circuit 104 generates a different gear within the tuning range of VCO circuit 104. Each of the voltage-controlled oscillators in circuit 104 may be, for example, a ring oscillator or an LC tank oscillator. The output clock signals of the voltage-controlled oscillators in circuit 104 are multiplexed to generate different output clock frequencies in response to different supply voltages VCOSV.

Voltage-controlled oscillator (VCO) circuit 104 has multiple gears that provide a wide tuning range for clock signal VCLK and any other output clock signals of VCO circuit 104. Each of the gears of VCO circuit 104 overlaps in frequency with one or two adjacent gears of VCO circuit 104 to provide the wide tuning range. However, process variations and mismatches in the transistors in VCO circuit 104 may cause adjacent gears of VCO circuit 104 to have too much, too little, or no overlap in frequency. Too much, too little, or no overlap in frequency between two adjacent gears of VCO circuit 104 may undesirably limit the tuning range of VCO circuit 104.

Figure 2A:
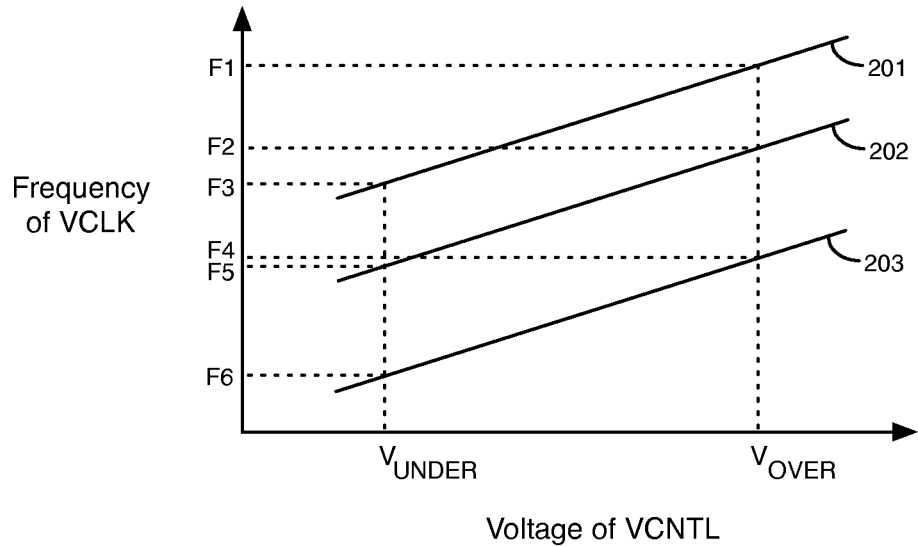
FIG. 2A illustrates examples of three gears of the voltage-controlled oscillator circuit shown in FIG. 1, according to an embodiment of the present invention.

FIG. 2A illustrates examples of three gears 201-203 of VCO circuit 104, according to an embodiment of the present invention. In FIG. 2A, $V_{UNDER}$ is the minimum control voltage VCNTL for which VCO circuit 104 can generate reliable output clock signals, and $V_{OVER}$ is the maximum control voltage VCNTL for which VCO circuit 104 can generate reliable output clock signals. The gears of VCO circuit 104 are valid within a range of the control voltage VCNTL between $V_{UNDER}$ and $V_{OVER}$.

Gear 201 corresponds to the frequency range between frequencies F3 and F1 for clock signal VCLK. Gear 202 corresponds to the frequency range between frequencies F5 and F2 for clock signal VCLK. Gear 203 corresponds to the frequency range between frequencies F6 and F4 for clock signal VCLK. In the example of FIG. 2A, gear 202 of VCO circuit 104 overlaps too much with gear 201 and not enough with gear 203. Thus, the maximum frequency F4 of gear 203 is too close to the minimum frequency F5 of gear 202. Process variations between multiple integrated circuits that have the circuitry of FIG. 1 may cause one or more of the integrated circuits to have no overlap or too little overlap between the frequency ranges of gears 202 and 203. Without overlap between each pair of adjacent gears of an oscillator, the oscillator does not have a continuous tuning range.

The gear control circuit 120 can adjust the gears of VCO circuit 104 by varying the oscillator supply voltages VCOSV that correspond to those gears. Gear control circuit 120 can adjust one or more of the gears of VCO circuit 104 to provide enough overlap between adjacent gears of VCO circuit 104 over expected variations in process and temperature.

Figure 2B:
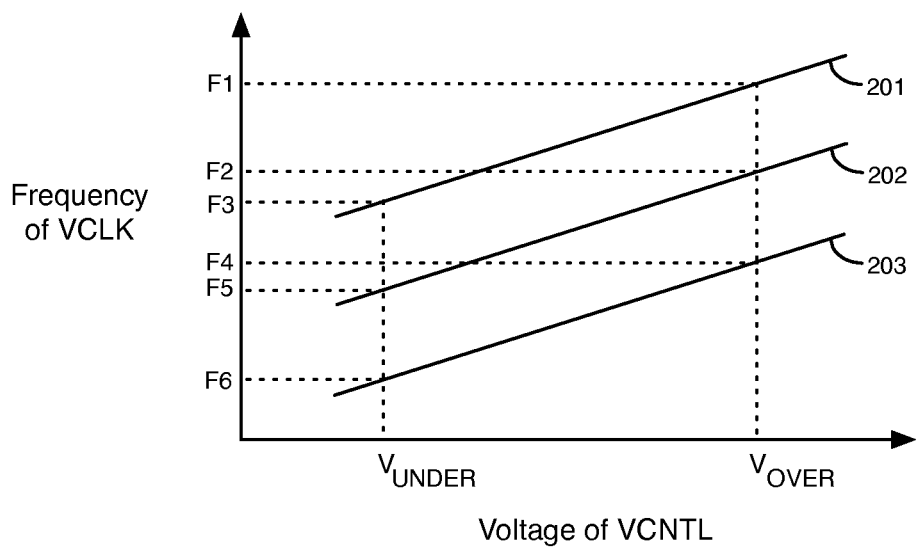
FIG. 2B illustrates examples of the three gears shown in FIG. 2A after one of the gears has been adjusted by the gear control circuit of FIG. 1, according to an embodiment of the present invention.

FIG. 2B illustrates examples of the three gears 201-203 of VCO circuit 104 shown in FIG. 2A after gear 202 has been adjusted by gear control circuit 120, according to an embodiment of the present invention. Gear control circuit 120 decreases the frequencies in gear 202 by decreasing the oscillator supply voltage VCOSV used to generate gear 202. As shown in FIG. 2B, the frequencies in gear 202 have decreased relative to gear 202 shown in FIG. 2A. The difference between frequencies F4 and F5 in FIG. 2B is about the same as the difference between frequencies F2 and F3 in FIG. 2B. Therefore, gear control circuit 120 provides more overlap between gears 202 and 203 as shown in FIG. 2B to account for expected variations in process and temperature.

Referring again to FIG. 1, gear control circuit 120 measures the gears of VCO circuit 104 during a gear adjustment mode. The gear adjustment mode may be an open loop adjustment mode or a closed loop adjustment mode. If any of the gears of VCO circuit 104 have too much or not enough overlap in frequency with one or more other gears of VCO circuit 104, gear control circuit 120 adjusts one or more of the oscillator supply voltages VCOSV that correspond to one or more of the gears of VCO circuit 104 during the gear adjustment mode. Gear control circuit 120 adjusts one or more of the gears of VCO circuit 104 during the gear adjustment mode to cause each gear of VCO circuit 104 to have a desired overlap in frequency with one or more of the other gears of VCO circuit 104 to provide a desired tuning range for VCO circuit 104.

The closed loop adjustment mode is now described in detail. During the closed loop adjustment mode, a periodic reference clock signal RCLK is provided to an input of PFD circuit 101, and PLL circuit 100 functions as described above with respect to the PLL mode. In the closed loop adjustment mode, under/over range detector circuit 112 is used to adjust the gears of VCO circuit 104. The control voltage VCNTL is provided to an input of under/over range detector circuit 112. An over range threshold voltage VTO and an under range threshold voltage VTU are provided to additional inputs of under/over range detector circuit 112.

Under/over range detector circuit 112 includes comparator circuits that compare the control voltage VCNTL to the threshold voltages VTO and VTU during the closed loop adjustment mode. Under/over range detector circuit 112 compares the control voltage VCNTL to the over range threshold voltage VTO to generate an over range detection signal OV. Under/over range detector circuit 112 compares the control voltage VCNTL to the under range threshold voltage VTU to generate an under range detection signal UN.

The over range threshold voltage VTO equals the maximum voltage of control voltage VCNTL. The under range threshold voltage VTU equals the minimum voltage of control voltage VCNTL. The minimum and maximum voltages of control voltage VCNTL may, for example, be the minimum and maximum control voltages VCNTL, respectively, that cause VCO circuit 104 to generate stable oscillations in its output clock signals. Margin can be added to threshold voltages VTO and VTU to account for temperature drift in and aging of the circuitry used to generate these threshold voltages.

The over range detection signal OV and the under range detection signal UN are provided to multiplexing inputs of multiplexer circuit 113. Select signal SEL is provided to a select input of multiplexer circuit 113. In the closed loop adjustment mode, the select signal SEL is in a logic state that causes multiplexer circuit 113 to provide the values of the over range detection signal OV and the under range detection signal UN to the outputs of multiplexer circuit 113 as multiplexer output signals MXO. During the closed loop adjustment mode, the values of signals MXO equal the values of signals OV and UN. Multiplexer output signals MXO are provided to inputs of control circuit 114.

During the closed loop adjustment mode, control circuit 114 determines the minimum and maximum frequencies of the output clock signal VCLK of VCO circuit 104 for each gear of VCO circuit 104. During the closed loop adjustment mode, control circuit 114 causes PLL circuit 100 to vary the frequency of the output clock signal VCLK of VCO circuit 104 to determine the minimum and maximum frequencies of clock signal VCLK for each of the gears of VCO circuit 104.

In an exemplary embodiment, each of the gears of VCO circuit 104 has a linear frequency range, as shown for example, in FIGS. 2A-2B. In this embodiment, the minimum and maximum frequencies of clock signal VCLK in each gear of VCO circuit 104 can be used to determine the linear frequency range of the corresponding gear of VCO circuit 104. According to other embodiments, one or more of the gears of VCO circuit 104 have non-linear frequency ranges.

During the closed loop adjustment mode, control circuit 114 causes PLL circuit 100 to vary the frequency of clock signal VCLK by varying the frequency division value of frequency divider circuit 105 to measure the minimum and maximum frequencies of VCLK in each gear of VCO circuit 104. Control circuit 114 varies the frequency division value of frequency divider circuit 105 by changing the values of control signals DIV. In an embodiment, control circuit 114 increases the frequency division value of frequency divider circuit 105 to cause the frequency of clock signal VCLK to vary from its minimum frequency to its maximum frequency within each gear during the closed loop adjustment mode. In an alternative embodiment, control circuit 114 decreases the frequency division value of frequency divider circuit 105 to cause the frequency of clock signal VCLK to vary from its maximum frequency to its minimum frequency within each gear during closed loop adjustment mode.

The frequency of the reference clock signal RCLK during the closed loop adjustment mode is digitally encoded in control signals RFS and provided to inputs of control circuit 114. The values of control signals RFS may be stored in control circuit 114. Control circuit 114 determines the frequency of the reference clock signal RCLK during closed loop adjustment mode based on the values of control signals RFS.

Control circuit 114 determines when PLL circuit 100 is in lock based on the LOCK signal. As control circuit 114 varies the frequency division value of frequency divider circuit 105 during the closed loop adjustment mode, control circuit 114 determines when PLL circuit 100 is in lock and when PLL circuit 100 is out of lock based on the logic state of the LOCK signal. Control circuit 114 determines the minimum and maximum frequencies of clock signal VCLK for each gear of VCO circuit 104 based on when PLL circuit 100 enters and exits lock as the frequency of clock signal VCLK varies during the closed loop adjustment mode.

In an embodiment, control circuit 114 increases the frequency of clock signal VCLK during the closed loop adjustment mode by increasing the frequency division value of frequency divider circuit 105 to determine the minimum and maximum frequencies of VCLK within each gear of VCO circuit 104. Control circuit 114 causes regulator circuit 115 to generate a supply voltage VCOSV for a selected gear of VCO circuit 104. In this embodiment, control circuit 114 then generates a frequency division value of frequency divider circuit 105 using control signals DIV that causes control voltage VCNTL to equal its minimum voltage VTU. When control voltage VCNTL equals its minimum voltage VTU, under/over range detector circuit 112 changes signal UN. Control circuit 114 determines when the control voltage VCNTL equals its minimum voltage VTU based on a change in the signal in signals MXO that equals the value of the under range detection signal UN. Control circuit 114 then begins increasing the frequency division value of frequency divider circuit 105 to measure the minimum and maximum frequencies of clock signal VCLK within the selected gear of VCO circuit 104.

According to this embodiment, control circuit 114 determines the minimum frequency of clock signal VCLK based on the frequency division value of frequency divider circuit 105 that causes PLL circuit 100 to enter lock as indicated by the LOCK signal being asserted. When PLL circuit 100 is in lock, clock signals RCLK and FBCLK have the same frequencies and are aligned in phase within a margin. Control circuit 114 multiples the frequency division value of frequency divider circuit 105 that causes PLL circuit 100 to enter lock by the frequency of reference clock signal RCLK, as indicated by control signals RFS, to generate the minimum frequency of clock signal VCLK for the selected gear.

According to this embodiment, control circuit 114 determines the maximum frequency of clock signal VCLK based on the frequency division value of frequency divider circuit 105 that causes PLL circuit 100 to exit lock as indicated by the LOCK signal being de-asserted. Control circuit 114 multiples the frequency division value of frequency divider circuit 105 that causes PLL circuit 100 to exit lock by the frequency of reference clock signal RCLK, as indicated by control signals RFS, to generate the maximum frequency of clock signal VCLK for the selected gear. Control circuit 114 stores the minimum and maximum frequencies of clock signal VCLK calculated for each selected gear during the closed loop adjustment mode.

In this embodiment, control circuit 114 ends the measurement of each gear of VCO circuit 104 in the closed loop adjustment mode when a frequency division value of frequency divider circuit 105 causes control voltage VCNTL to equal its maximum voltage VTO. When control voltage VCNTL equals its maximum voltage VTO, under/over range detector circuit 112 changes signal OV. Control circuit 114 determines when the control voltage VCNTL equals its maximum voltage VTO based on a change in the signal in signals MXO that equals the value of the over range detection signal OV.

According to other embodiments, the frequency division values of frequency divider circuit 105 are generated by a circuit external to circuits 100 and 120 and are provided to circuit 105 during the closed loop adjustment mode. In these embodiments, the frequency division values of frequency divider circuit 105 are provided to control circuit 114 during the closed loop adjustment mode.

According to other embodiments, control circuit 114 decreases the frequency of clock signal VCLK during the closed loop adjustment mode by decreasing the frequency division value of frequency divider circuit 105 to measure the minimum and maximum frequencies of VCLK within each gear of VCO circuit 104. In this embodiment, control circuit 114 starts the measurement of each gear of VCO circuit 104 when the frequency division value of frequency divider circuit 105 causes the maximum control voltage VCNTL. Control circuit 114 ends the measurement of each gear of VCO circuit 104 when the frequency division value of frequency divider circuit 105 causes the minimum control voltage VCNTL. Control circuit 114 calculates the maximum frequency of clock signal VCLK by multiplying the frequency division value of circuit 105 that causes PLL circuit 100 to enter lock by the frequency of reference clock signal RCLK. Control circuit 114 calculates the minimum frequency of clock signal VCLK by multiplying the frequency division value of circuit 105 that causes PLL circuit 100 to exit lock by the frequency of reference clock signal RCLK.

After the start of the closed loop adjustment mode, control circuit 114 selects a first one of the gears of VCO circuit 104 by generating values of signals GCS corresponding to the first one of the gears. Regulator circuit 115 generates the supply voltage VCOSV that corresponds to the first one of the gears in response to the values of signals GCS corresponding to the first one of the gears. Control circuit 114 then determines the minimum and maximum frequencies of clock signal VCLK for the first one of the gears of VCO circuit 104 by varying the frequency division value of circuit 105 and analyzing the LOCK signal, according to one of the embodiments described above.

Subsequently, control circuit 114 selects a second one of the gears of VCO circuit 104 during the closed loop adjustment mode by generating values of signals GCS corresponding to the second one of the gears. Regulator circuit 115 generates the supply voltage VCOSV that corresponds to the second one of the gears in response to the values of signals GCS corresponding to the second one of the gears. Control circuit 114 then determines the minimum and maximum frequencies of clock signal VCLK for the second one of the gears of VCO circuit 104 by varying the frequency division value of circuit 105 and analyzing the LOCK signal, according to one of the embodiments described above.

This process is then repeated for each of the additional gears of VCO circuit 104. Control circuit 114 selects each gear of VCO circuit 104 at a different time, regulator circuit 115 generates the supply voltage VCOSV for the selected gear, and control circuit 114 determines the minimum and maximum frequencies of clock signal VCLK for the selected gear by varying the frequency division value of circuit 105 and analyzing the LOCK signal, according to one of the embodiments described above.

Control circuit 114 stores the minimum and maximum frequencies of clock signal VCLK that are calculated for each of the gears of VCO circuit 104 during the closed loop adjustment mode. Control circuit 114 also has access to ideal minimum and maximum frequencies of clock signal VCLK for each of the gears of VCO circuit 104. The ideal minimum and maximum frequencies of clock signal VCLK for each gear are selected to cause a desired overlap in frequency between the adjacent gears of VCO circuit 104. The ideal minimum and maximum frequencies of clock signal VCLK for each gear may be selected to provide a minimum amount of overlap between the adjacent gears of VCO circuit 104 over expected variations in process, voltage, and temperature.

The ideal minimum and maximum frequencies of clock signal VCLK may, for example, be provided to control circuit 114 from an external device or from another circuit in the integrated circuit. In an embodiment, the ideal frequency ranges for each of the gears of VCO circuit 104 are linear. In this embodiment, the ideal minimum and maximum frequencies of clock signal VCLK for each of the gears of VCO circuit 104 indicate the ideal frequency ranges for each of the corresponding gears of VCO circuit 104.

Control circuit 114 then compares the minimum frequency of each of the gears of VCO circuit 104 calculated during the closed loop adjustment mode to the ideal minimum frequency for each corresponding gear. Control circuit 114 also compares the maximum frequency of each of the gears of VCO circuit 104 calculated during the closed loop adjustment mode to the ideal maximum frequency for each corresponding gear. If any of the minimum or maximum frequencies for any of the gears of VCO circuit 104 that were calculated during the closed loop adjustment mode do not equal the corresponding ideal minimum or maximum frequency within an error margin, control circuit 114 determines an adjustment to the oscillator supply voltage VCOSV needed to cause the frequency range of the corresponding gear of VCO circuit 104 to be at or closer to its ideal frequency range.

In an embodiment, control circuit 114 calculates the frequency difference FDMIN between the ideal minimum frequency of each gear of VCO circuit 104 and the minimum frequency calculated during the closed loop adjustment mode for each corresponding gear. Control circuit 114 also calculates the frequency difference FDMAX between the ideal maximum frequency of each gear of VCO circuit 104 and the maximum frequency calculated during the closed loop adjustment mode for each corresponding gear.

Control circuit 114 then calculates the average of the absolute value of the frequency difference FDMIN for each gear and the absolute value of the frequency difference FDMAX for each respective gear to generate an average frequency difference for each respective gear. If any of the average frequency differences are equal to zero within an error margin, then control circuit 114 does not adjust control signals GCS for the corresponding gears. If any of the average frequency differences are greater than zero by more than the error margin, then control circuit 114 generates signals VS that indicate the value of that non-zero average frequency difference. Control circuit 114 may cause signals VS to indicate the value of each of multiple non-zero average frequency differences in successive time intervals. Signals VS are provided to look-up table (LUT) circuit 116.

LUT circuit 116 stores values indicating different voltage adjustments that can be provided to supply voltage VCOSV to generate various frequency changes in clock signal VCLK. In response to receiving values of signals VS that indicate an average frequency difference, LUT circuit 116 retrieves the voltage that supply voltage VCOSV needs to be adjusted to change the frequency of clock signal VCLK by the average frequency difference indicated by signals VS.

LUT circuit 116 then generates signals LR that indicate the voltage adjustment to provide to supply voltage VCOSV to change the frequency of clock signal VCLK by the average frequency difference indicated by signals VS. Signals LR are provided to inputs of control circuit 114. Control circuit 114 then adjusts the gear control signals GCS for the corresponding gear of VCO circuit 104 based on the voltage adjustment to the supply voltage VCOSV indicated by signals LR. The adjustment that control circuit 114 provides to the gear control signals GCS corresponding to a gear of VCO circuit 104 cause the supply voltage VCOSV for that gear to change to a voltage that causes the frequency range for that gear to shift by the average frequency difference indicated by signals VS, which is closer to or at that gear's ideal frequency range.

As an example that is not intended to be limiting, if the frequency of clock signal VCLK is inversely proportional to supply voltage VCOSV, control circuit 114 causes regulator circuit 115 to increase supply voltage VCOSV to decrease the frequencies of VCLK in a corresponding gear of VCO circuit 104. According to this example, control circuit 114 causes regulator circuit 115 to decrease supply voltage VCOSV to increase the frequencies of VCLK in a corresponding gear of VCO circuit 104. According to another example, the frequency of clock signal VCLK is directly proportional to supply voltage VCOSV.

Control circuit 114 generates digital values in signals VS indicating each of the non-zero average frequency differences between the ideal and calculated frequencies of clock signal VCLK in successive time intervals. LUT circuit 116 causes signals LR to indicate a unique voltage adjustment to provide to supply voltage VCOSV in response to each set of digital values in signals VS that indicates a unique average frequency difference. Each voltage adjustment to supply voltage VCOSV indicated by signals LR is selected to change the frequency of clock signal VCLK within a corresponding gear of VCO circuit 104 by the average frequency difference indicated by signals VS. Control circuit 114 adjusts the gear control signals GCS for the gears of VCO circuit 104 having the non-zero average frequency differences to cause regulator circuit 115 to shift the supply voltages VCOSV for those gears by the voltage adjustments indicated by the respective sets of values of signals LR. The voltage adjustment provided to supply voltage VCOSV for a gear of VCO circuit 104 causes the frequency range for that gear to shift closer to its ideal frequency range.

The open loop adjustment mode is now described in detail. In the open loop adjustment mode, charge pump circuit 102 is off, and frequency detector circuit 111 is used to adjust the gears of VCO circuit 104. Because charge pump circuit 102 is off, PLL circuit 100 is in an open loop state and does not function in PLL mode.

As shown in FIG. 1, an enable signal EN is provided to an enable input of charge pump circuit 102. In an embodiment, charge pump circuit 102 is on when enable signal EN is asserted and off when enable signal EN is de-asserted. Enable signal EN is de-asserted during open loop adjustment mode to turn off charge pump 102, and enable signal EN is asserted during closed loop adjustment mode and during PLL mode to turn on charge pump 102. When charge pump 102 is off in the open loop adjustment mode, charge pump 102 does not affect the control voltage VCNTL.

During the open loop adjustment mode, periodic reference clock signal RCLK is provided to a first input of frequency detector circuit 111, and feedback clock signal FBCLK is provided to a second input of frequency detector circuit 111. During the open loop adjustment mode, frequency detector circuit 111 compares the frequency of reference clock signal RCLK to the frequency of feedback clock signal FBCLK to generate frequency detection signals CNT. The frequency detection signals CNT generated by frequency detector circuit 111 during open loop adjustment mode indicate the frequency difference between clock signals RCLK and FBCLK.

In an embodiment, frequency detector circuit 111 includes a counter circuit, and the frequency detection signals CNT are count signals generated by the counter circuit. The counter circuit in frequency detector circuit 111 is clocked by the reference clock signal RCLK. The counter circuit in frequency detector circuit 111 may be, for example, an up/down counter circuit. According to this example, the up/down counter circuit increases the binary value of the count signals CNT when the frequency of the feedback clock signal FBCLK is greater than the frequency of the reference clock signal RCLK. The up/down counter circuit decreases the binary value of the count signals CNT when the frequency of the feedback clock signal FBCLK is less than the frequency of the reference clock signal RCLK.

In open loop adjustment mode, the select signal SEL is in a logic state that causes multiplexer circuit 113 to provide the values of signals CNT to the outputs of multiplexer circuit 113 in multiplexer output signals MXO. Thus, during the open loop adjustment mode, the values of signals MXO equal the values of signals CNT. Multiplexer output signals MXO are provided to inputs of control circuit 114.

During open loop adjustment mode, the control voltage VCNTL is forced to equal over range threshold voltage VTO to measure the maximum frequency of clock signal VCLK in each gear of VCO circuit 104. Also, during the open loop adjustment mode, the control voltage VCNTL is forced to equal under range threshold voltage VTU to measure the minimum frequency of clock signal VCLK in each gear of VCO circuit 104. The control voltage VCNTL may be forced to voltages VTU and VTO by an external device through a pin of the integrated circuit that is coupled to the VCNTL node. Alternatively, control voltage VCNTL may be forced to voltages VTU and VTO by control circuit 114 or by another circuit that is in the same integrated circuit as circuits 100 and 120.

After the start of open loop adjustment mode, control circuit 114 generates values for the gear control signals GCS that cause regulator circuit 115 to generate a first supply voltage VCOSV. The first supply voltage VCOSV corresponds to a first gear of VCO circuit 104. Control voltage VCNTL is forced to equal under range threshold voltage VTU. Control circuit 114 then calculates the minimum frequency of clock signal VCLK for the first gear of VCO circuit 104 based on the frequency difference indicated by signals MXO, the frequency of reference clock signal RCLK as indicated by signals RFS, and the frequency division value of frequency divider circuit 105 as indicated by signals DIV to generate a calculated minimum frequency of clock signal VCLK for the first gear. Control circuit 114 then calculates the frequency difference FDMIN between the calculated minimum frequency of clock signal VCLK for the first gear and the ideal minimum frequency of clock signal VCLK for the first gear.

Subsequently, control voltage VCNTL is forced to equal over range threshold voltage VTO. Control circuit 114 then calculates the maximum frequency of clock signal VCLK for the first gear of VCO circuit 104 based on the frequency difference indicated by signals MXO, the frequency of reference clock signal RCLK as indicated by signals RFS, and the frequency division value of frequency divider circuit 105 as indicated by signals DIV to generate a calculated maximum frequency of clock signal VCLK for the first gear. Control circuit 114 then calculates the frequency difference FDMAX between the calculated maximum frequency of clock signal VCLK for the first gear and the ideal maximum frequency of clock signal VCLK for the first gear.

Control circuit 114 then calculates the average of the absolute value of frequency difference FDMIN for the first gear and the absolute value of frequency difference FDMAX for the first gear to generate an average frequency difference for the first gear. If this average frequency difference is equal to zero within an error margin, then control circuit 114 does not adjust control signals GCS for the first gear. If this average frequency difference is greater than zero by more than the error margin, then control circuit 114 generates values of signals VS that indicate this average frequency difference.

LUT circuit 116 generates values in signals LR that indicate a voltage adjustment to supply voltage VCOSV based on the values of signals VS indicating the average frequency difference, as described above with respect to the closed loop adjustment mode. Control circuit 114 then adjusts signals GCS for the first gear based on the voltage adjustment indicated by signals LR. Control circuit 114 adjusts signals GCS based on signals LR to cause regulator circuit 115 to adjust supply voltage VCOSV to a voltage that shifts the frequency range of the first gear of VCO circuit 104 to at or closer to its ideal frequency range.

The operations described above are then repeated for each additional gear of VCO circuit 104. Thus, control circuit 114 generates values for the gear control signals GCS that cause regulator circuit 115 to generate the supply voltage VCOSV for each additional gear of VCO circuit 104. After the control voltage VCNTL is forced to the under range threshold voltage VTU, control circuit 114 calculates the minimum frequency of clock signal VCLK in each additional gear. After the control voltage VCNTL is forced to the over range threshold voltage VTO, control circuit 114 calculates the maximum frequency of clock signal VCLK in each additional gear.

The absolute value of the difference between the calculated minimum frequency and the ideal minimum frequency of clock signal VCLK is averaged with the absolute value of the difference between the calculated maximum frequency and the ideal maximum frequency of clock signal VCLK to generate an average frequency difference for each additional gear. For each of the average frequency differences that is greater than zero by the error margin, the average frequency difference is provided to LUT circuit 116 in signals VS. Control circuit 114 then adjusts the corresponding values of signals GCS based on the voltage adjustment accessed from LUT circuit 116 for each corresponding gear having a non-zero average frequency difference. The adjustment provided to signals GCS for each gear having a non-zero average frequency difference generates a corresponding supply voltage VCOSV that causes the frequency range of each corresponding gear to be closer to its ideal frequency range.

Thus, during the open loop adjustment mode, the frequency of clock signal VCLK is not swept across its frequency range within each of the gears of VCO circuit 104. Gear control circuit 120 calculates the minimum and maximum frequencies of clock signal VCLK in each gear of VCO circuit 104 in the open loop adjustment mode without determining when PLL circuit 100 enters and exits lock. Therefore, gear control circuit 120 may be able to adjust the gears of VCO circuit 104 in less time in the open loop adjustment mode compared to the closed loop adjustment mode. However, the frequency resolution that gear control circuit 120 provides to the gears of VCO circuit 104 in the open loop adjustment mode may be less accurate than in the closed loop adjustment mode, depending on the circuit design of frequency detector circuit 111.

Figure 3:
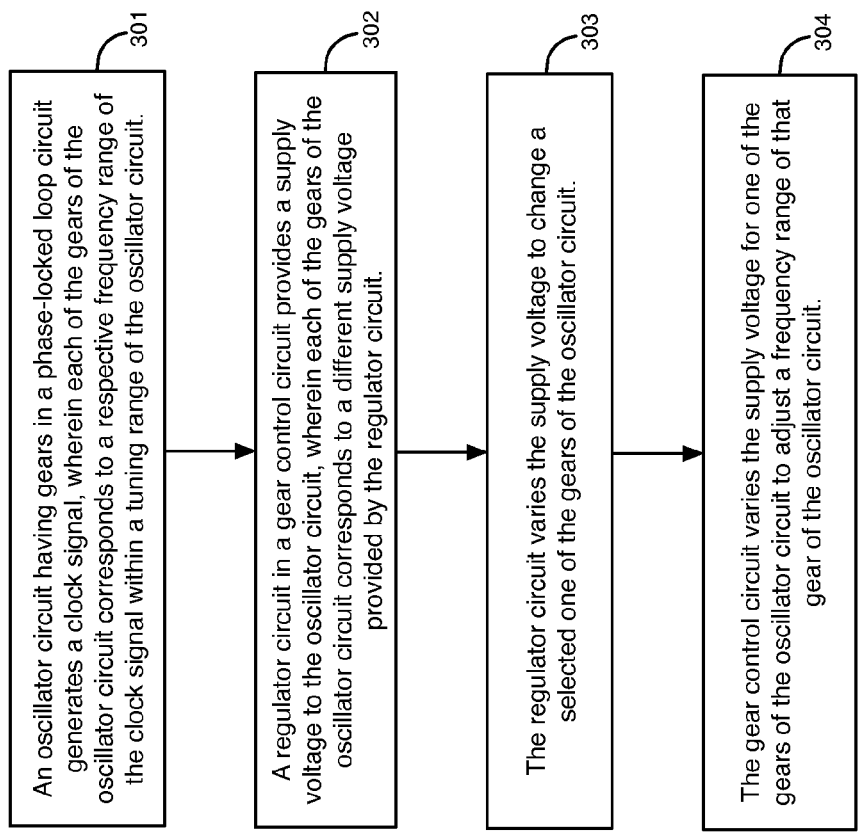
FIG. 3 illustrates operations that can be performed to adjust one or more gears of an oscillator circuit in a phase-locked loop circuit, according to an embodiment of the present invention.

FIG. 3 illustrates operations that can be performed to adjust one or more gears of an oscillator circuit in a phase-locked loop circuit, according to an embodiment of the present invention. In operation 301, an oscillator circuit having gears in a phase-locked loop circuit generates a clock signal. Each of the gears of the oscillator circuit corresponds to a respective frequency range of the clock signal within a tuning range of the oscillator circuit. In operation 302, a regulator circuit in a gear control circuit provides a supply voltage to the oscillator circuit. Each of the gears of the oscillator circuit corresponds to a different supply voltage provided by the regulator circuit. In operation 303, the regulator circuit varies the supply voltage to change a selected one of the gears of the oscillator circuit. In operation 304, the gear control circuit varies the supply voltage for one of the gears of the oscillator circuit to adjust a frequency range of that gear of the oscillator circuit.

Figure 4:
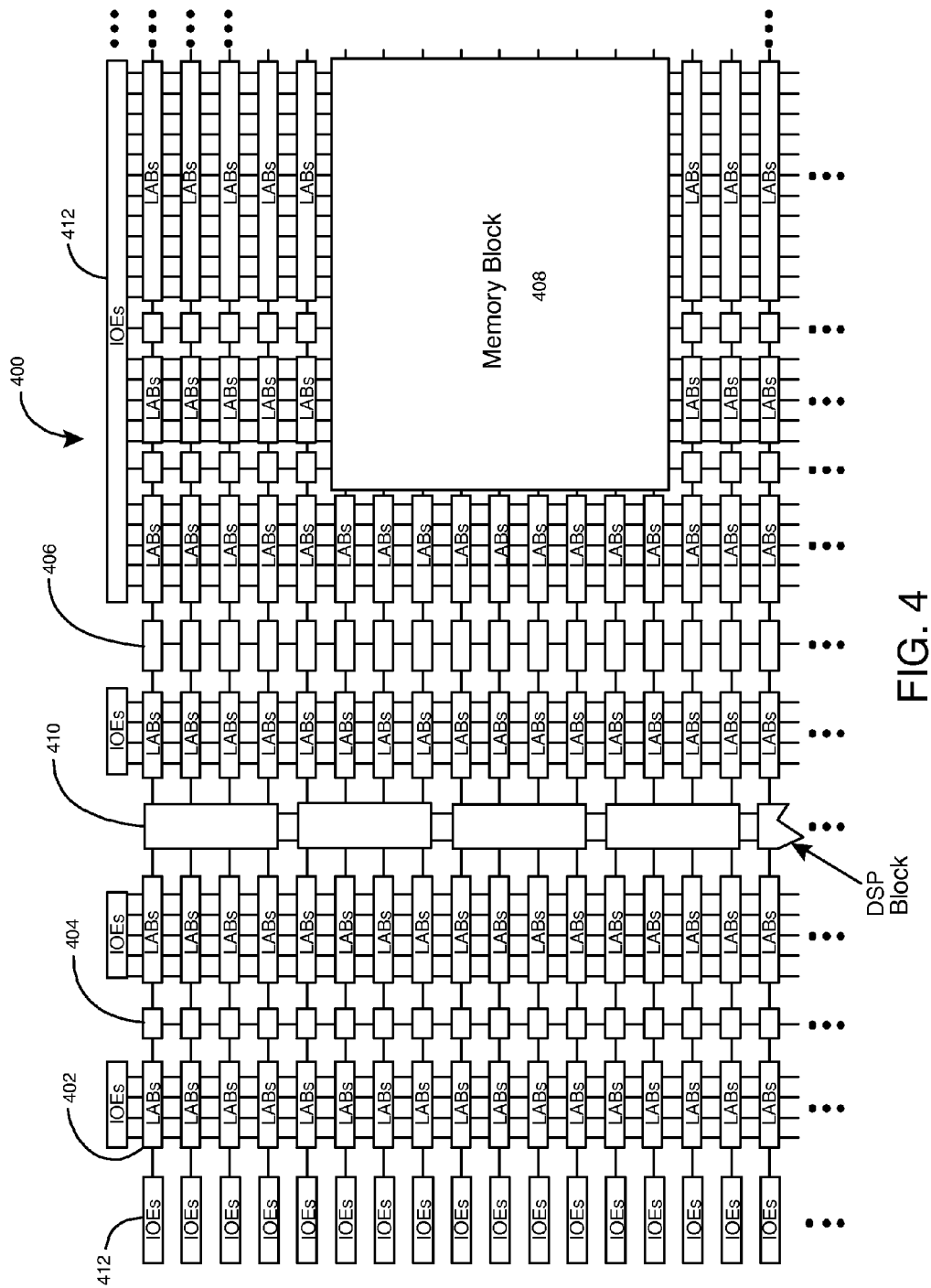
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes an array of programmable logic array blocks (or LABs) 402 that are interconnected by a network of column and row interconnect conductors of varying length and speed. LABs 402 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 support numerous single-ended and differential input/output standards. IOEs 412 include input and output buffers that are coupled to pins of the integrated circuit. The pins are external terminals of the FPGA die that can be used to route, for example, input signals, output signals, and supply voltages between the FPGA and one or more external devices. FPGA 400 may also include PLL circuit 100 and gear control circuit 120, as shown in FIG. 1. FPGA 400 is described herein for illustrative purposes. Embodiments of the present invention can be implemented in many different types of integrated circuits.

Figure 5:
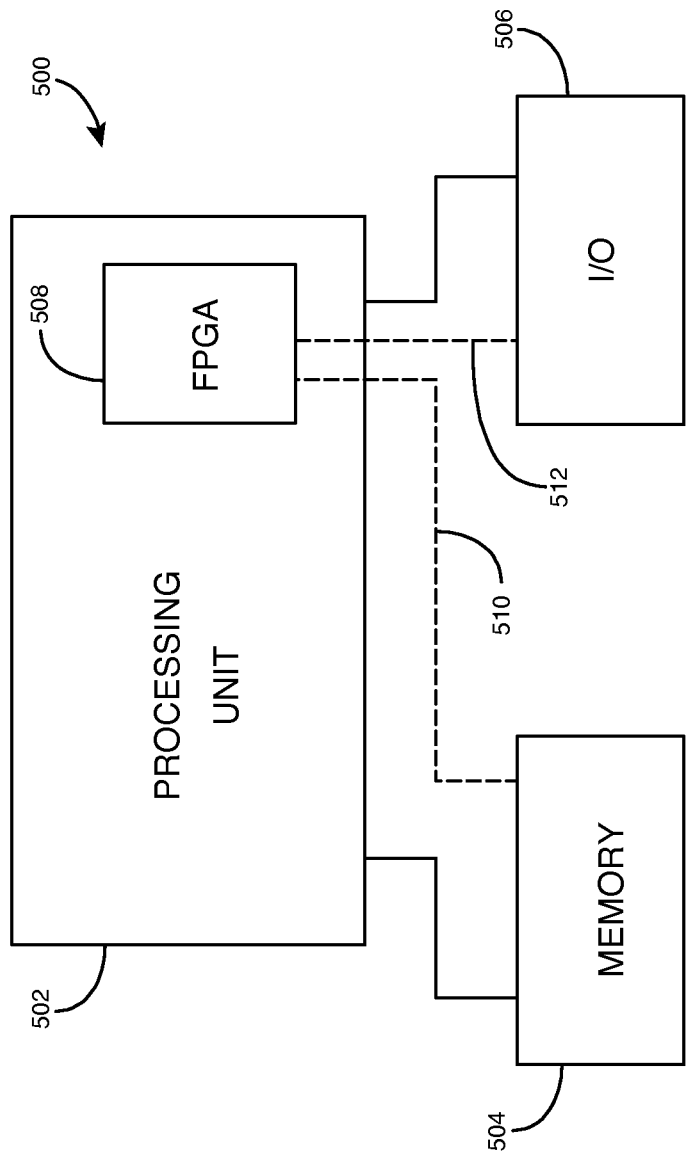
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a phase-locked loop circuit comprising an oscillator circuit to generate a first clock signal, wherein the oscillator circuit comprises gears, and wherein each of the gears of the oscillator circuit corresponds to a different frequency range of the first clock signal; and
a gear control circuit comprising a regulator circuit to provide a supply voltage to the oscillator circuit, wherein each of the gears of the oscillator circuit corresponds to a different supply voltage provided by the regulator circuit, wherein the regulator circuit varies the supply voltage to change a selected one of the gears of the oscillator circuit, and wherein the gear control circuit varies the supply voltage for a first one of the gears of the oscillator circuit to adjust overlap between a frequency range of the first one of the gears of the oscillator circuit and a frequency range of a second one of the gears of the oscillator circuit.

2. The circuit of claim 1, wherein the gear control circuit determines minimum and maximum frequencies of the first clock signal for the first one of the gears of the oscillator circuit, and wherein the gear control circuit compares the minimum and the maximum frequencies of the first clock signal to respective ideal minimum and maximum frequencies of the first clock signal for the first one of the gears of the oscillator circuit to generate a frequency difference.

3. The circuit of claim 2, wherein the gear control circuit causes the regulator circuit to vary the supply voltage for the first one of the gears of the oscillator circuit to adjust the frequency range of the first one of the gears of the oscillator circuit based on the frequency difference.

4. The circuit of claim 3, wherein the oscillator circuit varies a frequency of the first clock signal in response to changes in a control voltage, and wherein the gear control circuit further comprises a detector circuit that compares the control voltage to first and second threshold voltages to generate an indication of when the control voltage is within a voltage range defined by the first and the second threshold voltages.

5. A circuit comprising:
a phase-locked loop circuit comprising an oscillator circuit to generate a first clock signal, wherein the oscillator circuit comprises gears;
a gear control circuit comprising a regulator circuit to provide a supply voltage to the oscillator circuit, wherein each of the gears of the oscillator circuit corresponds to a supply voltage provided by the regulator circuit and to a frequency range of the first clock signal; and
a detector circuit that generates an indication of when the phase-locked loop circuit is in lock, wherein the gear control circuit determines frequencies of the first clock signal based on the indication of when the phase-locked loop circuit is in lock, and wherein the gear control circuit causes the regulator circuit to vary the supply voltage for one of the gears of the oscillator circuit to adjust a frequency range of the one of the gears of the oscillator circuit based on the frequencies determined for the first clock signal.

6. The circuit of claim 5, wherein the phase-locked loop circuit further comprises a frequency divider circuit that generates a second clock signal based on the first clock signal, wherein the frequency divider circuit causes a frequency of the second clock signal to have the frequency of the first clock signal divided by a frequency division value, wherein the oscillator circuit varies the frequency of the first clock signal in response to a control voltage, and wherein the gear control circuit varies the control voltage by changing the frequency division value of the frequency divider circuit.

7. The circuit of claim 3, wherein the gear control circuit further comprises a frequency detector circuit that compares a second clock signal that is generated based on the first clock signal to a third clock signal to generate an indication of a frequency difference between the second and the third clock signals, and wherein the gear control circuit determines the minimum and the maximum frequencies of the first clock signal for the first one of the gears of the oscillator circuit based on the indication of the frequency difference between the second and the third clock signals generated by the frequency detector circuit.

8. The circuit of claim 7, wherein the phase-locked loop circuit further comprises a phase frequency detector circuit coupled to a charge pump circuit, wherein the oscillator circuit varies a frequency of the first clock signal in response to changes in a control voltage generated by the charge pump circuit when the charge pump circuit is enabled, and wherein the charge pump circuit is disabled and the control voltage is forced to predetermined voltages for the gear control circuit to determine the minimum and the maximum frequencies of the first clock signal for the first one of the gears of the oscillator circuit.

9. A circuit comprising:
a phase-locked loop circuit comprising an oscillator circuit that generates a first clock signal, wherein the oscillator circuit comprises gears, and wherein each of the gears of the oscillator circuit corresponds to a different frequency range of the first clock signal within a tuning range of the oscillator circuit; and
a gear control circuit comprising a regulator circuit that provides a supply voltage to the oscillator circuit, wherein each of the gears of the oscillator circuit is generated in response to a different supply voltage provided by the regulator circuit, wherein the regulator circuit changes a selected one of the gears of the oscillator circuit by varying the supply voltage, wherein the gear control circuit determines a frequency of the first clock signal in a first one of the gears of the oscillator circuit, wherein the gear control circuit compares the frequency of the first clock signal determined for the first one of the gears to a respective ideal frequency of the first clock signal for the first one of the gears to generate a frequency difference, and wherein the gear control circuit varies the supply voltage for the first one of the gears to adjust a frequency range of the first one of the gears based on the frequency difference.

10. The circuit of claim 9, wherein the oscillator circuit varies the frequency of the first clock signal based on a control voltage, and wherein the gear control circuit further comprises:

an under and over range detector circuit to compare the control voltage to first and second threshold voltages to generate a comparison output;

a frequency detector circuit to generate a frequency detection output based on a frequency difference between a second clock signal and a third clock signal, wherein the second clock signal is generated based on the first clock signal; and a multiplexer circuit coupled to the frequency detector circuit and to the under and over range detector circuit.

11. The circuit of claim 10, wherein the gear control circuit further comprises:

a second control circuit, wherein the multiplexer circuit provides a value of the comparison output to the second control circuit during a closed loop adjustment mode, and wherein the multiplexer circuit provides a value of the frequency detection output to the second control circuit during an open loop adjustment mode.

12. The circuit of claim 11, wherein the phase-locked loop circuit further comprises:

a frequency divider circuit to generate the second clock signal based on the first clock signal;

a phase frequency detector circuit to generate a phase error signal based on a phase difference between the second clock signal and the third clock signal; and a charge pump circuit to generate the control voltage based on the phase error signal, wherein the charge pump circuit is enabled during the closed loop adjustment mode, and wherein the charge pump circuit is disabled during the open loop adjustment mode.

13. The circuit of claim 11, wherein the phase-locked loop circuit further comprises:

a lock detector circuit to generate a lock signal indicating when the phase-locked loop circuit is in lock, wherein the gear control circuit determines the frequency of the first clock signal in the first one of the gears of the oscillator circuit based on the lock signal as the control voltage varies between voltages indicated by the first and the second threshold voltages during the closed loop adjustment mode.

14. The circuit of claim 13, wherein the phase-locked loop circuit further comprises:

a frequency divider circuit to cause a frequency of the second clock signal to equal the frequency of the first clock signal divided by a frequency division value, and wherein the gear control circuit varies the control voltage between voltages indicated by the first and the second threshold voltages by changing the frequency division value of the frequency divider circuit.

15. The circuit of claim 12, wherein the gear control circuit determines the frequency of the first clock signal in the first one of the gears of the oscillator circuit based on the frequency detection output during the open loop adjustment mode, and wherein the control voltage is forced to a predetermined voltage for the gear control circuit to determine the frequency of the first clock signal in the first one of the gears of the oscillator circuit during the open loop adjustment mode.

16. A method comprising:

generating a first clock signal using an oscillator circuit in a phase-locked loop circuit, wherein the oscillator circuit comprises gears, and wherein each of the gears of the oscillator circuit corresponds to a respective frequency range of the first clock signal within a tuning range of the oscillator circuit;

providing a supply voltage to the oscillator circuit using a regulator circuit in a gear control circuit, wherein each of the gears of the oscillator circuit is generated in response to a different supply voltage provided by the regulator circuit;

varying the supply voltage to change a selected one of the gears of the oscillator circuit; and varying the supply voltage for a first one of the gears of the oscillator circuit using the gear control circuit to adjust overlap between a frequency range of the first one of the gears of the oscillator circuit and a frequency range of a second one of the gears of the oscillator circuit.

17. The method of claim 16, wherein varying the supply voltage for a first one of the gears of the oscillator circuit using the gear control circuit to adjust overlap between a frequency range of the first one of the gears of the oscillator circuit and a frequency range of a second one of the gears of the oscillator circuit further comprises:

determining a frequency of the first clock signal for the first one of the gears of the oscillator circuit;

comparing the frequency of the first clock signal determined for the first one of the gears to an ideal frequency of the first clock signal for the first one of the gears to generate a frequency difference; and varying the supply voltage for the first one of the gears of the oscillator circuit using the gear control circuit to adjust the frequency range of the first one of the gears based on the frequency difference.

18. The method of claim 17, wherein determining a frequency of the first clock signal for the first one of the gears of the oscillator circuit comprises:

varying a control voltage between first and second threshold voltages during a closed loop adjustment mode, wherein the oscillator circuit varies the frequency of the first clock signal in response to changes in the control voltage, generating a lock signal indicating when the phase-locked loop circuit is in lock using a first detector circuit in the gear control circuit, and determining the frequency of the first clock signal for the first one of the gears of the oscillator circuit based on the lock signal.

19. The method of claim 18, wherein determining a frequency of the first clock signal for the first one of the gears of the oscillator circuit further comprises:

comparing the control voltage to the first and the second threshold voltages to generate an indication of when the control voltage is within a voltage range defined by the first and the second threshold voltages using a second detector circuit in the gear control circuit.

20. The method of claim 17, wherein determining a frequency of the first clock signal for the first one of the gears of the oscillator circuit comprises:

generating a frequency detection signal based on a frequency difference between a second clock signal and a third clock signal, wherein the second clock signal is generated based on the first clock signal, and wherein the oscillator circuit varies the frequency of the first clock signal in response to changes in a control voltage; and forcing the control voltage to a predetermined voltage for the gear control circuit to determine the frequency of the first clock signal for the first one of the gears of the oscillator circuit based on the frequency detection signal during an open loop adjustment mode.

* * * * *